United States Patent [19]

Tenhover et al.

[11] Patent Number: 4,851,296

[45] Date of Patent: Jul. 25, 1989

[54] PROCESS FOR THE PRODUCTION OF MULTI-METALLIC AMORPHOUS ALLOY COATINGS ON A SUBSTRATE AND PRODUCT

[75] Inventors: Michael A. Tenhover; Richard S. Henderson, both of Solon; Robert K. Grasselli, Aurora, all of Ohio

[73] Assignee: The Standard Oil Company, Cleveland, Ohio

[21] Appl. No.: 931,494

[22] Filed: Nov. 17, 1986

Related U.S. Application Data

[63] Continuation of Ser. No. 751,705, Jul. 3, 1985, abandoned.

[51] Int. Cl.$^4$ .................. B32B 15/04; C23C 16/18
[52] U.S. Cl. .................. 428/457; 427/252; 427/255; 428/627; 428/674; 428/680; 428/681; 428/689; 428/697
[58] Field of Search ............ 427/249, 255, 255.2, 427/252, 124, 132, 314, 319; 428/457, 689, 697, 698, 704, 627, 668, 681, 660, 662, 663, 669, 680, 674

[56] References Cited

U.S. PATENT DOCUMENTS

| | | | |
|---|---|---|---|
| 3,018,194 | 1/1962 | Norman et al. | 427/252 |
| 3,061,464 | 10/1962 | Norman et al. | 427/252 |
| 3,061,465 | 10/1962 | Norman et al. | 427/252 |
| 3,071,493 | 1/1963 | Whaley et al. | 427/252 |
| 3,083,550 | 4/1963 | Averbach | 427/252 |
| 3,206,325 | 9/1965 | Averbach | 427/252 |
| 3,244,554 | 4/1966 | Prestridge et al. | 427/252 |
| 4,510,182 | 4/1985 | Cornils et al. | 427/252 |

*Primary Examiner*—Sadie Childs
*Attorney, Agent, or Firm*—Larry W. Evans; Joseph G. Curatolo; Sue E. Phillips

[57] ABSTRACT

A process is disclosed for the formation of amorphous multi-metallic alloy coatings. More specifically, a chemical vapor deposition process is described wherein precursor compounds are induced to decompose upon a substrate under controlled parameters so as to form a coating on the substrate that is a substantially amorphous multi-metallic alloy. Preferred amorphous alloy compositions are also taught that are ideally synthesized by the claimed process.

15 Claims, No Drawings

PROCESS FOR THE PRODUCTION OF MULTI-METALLIC AMORPHOUS ALLOY COATINGS ON A SUBSTRATE AND PRODUCT

CROSS REFERENCE TO RELATED APPLICATION

This application is a File Wrapper Continuation of application Ser. No. 751,705, filed July 3, 1985 which is now abandoned.

FIELD OF THE INVENTION

The present invention relates to a process for the formation of multi-metallic amorphous alloy coatings. This process makes possible the low-cost coating of metal non-metallic objects with amorphous materials. The process is especially useful for the production of amorphous magnetic thin films and corrosion resistant coatings.

BACKGROUND OF THE INVENTION

Amorphous metal alloy materials have become of interest in recent years due to their unique combinations of mechanical, chemical and electrical properties. The properties of amorphous metal alloy materials may be attributed to their disordered atomic structure which ensures that the material is chemically homogeneous and free from the extended defects, such as dislocations and grain boundaries, that are known to limit the preformance of crystalline materials. The amorphous state is characterized by a lack of long range periodicity, whereas a characteristic of the crystalline state is its long range periodicity.

Generally, the room temperature stability of amorphous materials depends on various kinetic barriers to the growth of crystal nuclei and on nucleation barriers that hinder the formation of stable crystal nuclei. Such barriers typically are present if the material to be made amorphous is first heated to a molten state then rapidly quenched or cooled through the crystal nucleation temperature range at a rate that is sufficiently fast to prevent significant nucleation to occur. Such cooling rates are on the order of $10^6$° C./second. Rapid cooling dramatically increases the viscosity of the molten alloy and quickly decreases the length over which atoms can diffuse. This has the effect of preventing crystalline nuclei from forming and yields a metastable, or amorphous phase.

Processes that provide such cooling rates include sputtering, vacuum evaporation, plasma spraying and direct quenching from the liquid state. It has been found that alloys produced by one method often cannot be similarly produced by another method even though the pathway to formation is in theory the same.

Direct quenching from the liquid state has found the greatest commercial success since a variety of alloys are known that can be manufactured by this technique in various forms such as thin films, ribbons and wires. U.S. Pat. No. 3,856,513 to Chen et al. describes novel metal alloy compositions obtained by direct quenching from the melt and includes a general discussion of this process.

The thickness of essentially all amorphous foils and ribbons formed by rapid cooling from the melt are limited by the rate of heat transfer through the material. Generally the thickness of such a film is less than 50 micrometers. This limitation on the form of synthesized amorphous metal alloys has initiated active research into other forming processes that can produce amorphous metal alloys in other shapes.

Sawmer disclosed the formation of amorphous Zr-Co alloys by a solid state reaction in a multilayer configuration, Fifth International Conference on Rapidly Quenched Metals, Wurzburg, Germany, September, 1984. Zirconium and cobalt films, having thicknesses between 100 and 500 Angstroms, were layered together and heat treated at about 180° C. A diffusion process formed an amorphous Zr-Co phase at the interface of each adjacent layer.

Similarly, R. B. Schwartz and W. L. Johnson described the solid-state interdiffusion of pure polycrystalline Au and La thin films at temperatures between 50° C. and 80° C., "Formation of an Amorphous Alloy by Solid-State Reaction of the Pure Polycrystalline Metals", Physics Review Letters, Vol. 51, No. 5, August 1, 1983. These processes are limited to a reaction depending on the physical intimacy of two metal films.

Co-pending patent applications U.S.S.N. Ser. No. 586,380 entitled "Amorphous Metal Alloy Powders and Synthesis of Same by Solid State Decomposition Reactions" and U.S.S.N. Ser. No. 588,014 entitled "Amorphous Metal Alloy Powders and Synthesis of Same by Solid State Chemical Reduction Reactions" disclose novel processes for the obtention of amorphous metal alloys in the form of powders.

In spite of these recent advances, the widespread use of amorphous metal alloys continues to be hindered by the limited forms in which such materials are available. The need continues for new processes to synthesize amorphous metal alloys in desired shapes and forms. Especially in need is a process for the economical formation of multi-metallic amorphous metal alloy coatings.

While many amorphous metal alloys have been identified as possessing corrosion resistance to acid and base environments, none are described as coating materials since they are unavailable in such a form. U.S. Pat. No. 4,318,738 to Matsumoto et al. discloses multi-metallic carbon series amorphous alloys having corrosion resistance and taught only as powders, wires or sheets. What is needed in the field of corrosion resistant amorphous metal alloys is a commercially viable process for producing such alloys as coatings.

Multi-metallic amorphous metal alloy coatings would also have ready applications in the fields of catalytic reactions, electrochemical reactions, magnetic thin films for information storage, and metallic films for decorative and/or consumer items.

It is apparent that a low cost production process for the formation of amorphous multi-metallic alloy coatings would be a significant contribution to the field of amorphous metal alloys and their applications.

Thus, it is one object of the present invention to provide a process for the synthesis of multi-metallic amorphous alloy coatings.

It is another object of the present invention to provide novel multi-metallic amorphous alloy coatings.

It is another object of the present invention to provide novel corrosion-resistant, multi-metallic amorphous alloy coatings.

These and other objects of the present invention will become apparent to one skilled in the art from the following description of the invention and the appended claims.

SUMMARY OF THE INVENTION

The present invention relates to a process for depositing a substantially amorphous multi-metallic coating onto a substrate, which process comprises the steps of:
(a) providing precursor metal-bearing compounds that contain the metals desired in the amorphous multi-metallic coating and which decompose at a temperature below the crystallization temperature of the amorphous multi-metallic coating to be formed;
(b) heating the substrate in an enclosed system to a temperature of at least the decomposition temperature of the precursor compounds;
(c) volatilizing the precursor compounds; and
(d) contacting the volatilized precursor compounds with the substrate in the enclosed system so as to cause the substantially amorphous multi-metallic coating to be formed on the substrate.

The present invention also contemplates the introduction of precursor compounds containing phosphorous, boron, nitrogen, arsenic, sulfur, silicon and carbon into the enclosed system so as to cause the introduction of these elements into the substantially amorphous multi-metallic coating.

This invention also relates to substantially amorphous multi-metallic alloy coatings formed in the above-described manner. The invention relates specifically to substantially amorphous multi-metallic alloy coatings of the formula:

$$M_a M'_b R_c$$

wherein
M is at least one element selected from the group consisting of Mo, W, Nb and Ta;
M' is at least one element selected from the group consisting of Fe, Ni, Co, Mn and Cr; and
R is at least one element selected from the group consisting of P, B, N, As, S, Si and C; and
wherein
a ranges from about 0.15 to about 0.85;
b ranges from about 0.15 to about 0.85; and
c ranges from zero to about 0.25;
with the proviso that when M' is Cr, then the sum (b due to M' elements other than Cr+c) will be at least 0.15; wherein said coatings are formed in the above-described manner.

DETAILED DESCRIPTION OF THE INVENTION

The multi-metallic alloy coatings described herein are substantially amorphous alloys. The term "substantially" as used herein with reference to the amorphous multi-metallic coatings indicates that these coatings are at least 50 percent amorphous as indicated by x-ray diffraction analysis. Preferably, the multi-metallic coating is at least 80 percent amorphous, and most preferably about 100 percent amorphous, as indicated by x-ray diffraction analysis. The use of the phrase "amorphous multi-metallic alloy" herein refers to amorphous metal-containing alloys that may also comprise non-metallic elements.

The substantially amorphous multi-metallic coatings contemplated by this disclosure can be represented by the formula:

$$M_a M'_b R_c$$

wherein
M is at least one element selected from the group consisting of Mo, W, Nb and Ta;
M' is at least one element selected from the group consisting of Fe, Ni, Co, Mn and Cr; and
R is at least one element selected from the group consisting of P, B, N, As, S, Si and C; and
wherein
a ranges from about 0.15 to about 0.85;
b ranges from about 0.15 to about 0.85; and
c ranges from zero to about 0.25;
with the proviso that when M' is Cr, then the sum (b due to M' elements other than Cr+c) will be at least 0.15. Preferably, the ranges of a, b and c are as follows:
a ranges from about 0.2 to about 0.7;
b ranges from about 0.2 to about 0.8; and
c ranges from zero to about 0.2.
Most preferably, the ranges of a, b and c are as follows:
a ranges from about 0.2 to about 0.4;
c ranges from about zero to about 0.2.

Examples of such substantially amorphous multi-metallic alloy coatings include compositions comprising: $Mo_a(Fe-Cr)_b$, $Mo_aCr_bC_c$, $Mo_aCr_bN_c$, and $Mo_aFe_b$. The foregoing list and the formula presented above are not intended to limit the materials which may be formed as coatings in accordance with the process taught herein. One skilled in the art will be able to readily use or adapt the process as taught herein to synthesize other coating compositions.

The process taught herein comprises the decomposition of at least two precursor metal-bearing compounds to form a substantially amorphous multi-metallic alloy. The precursor metal-bearing compounds are selected so that their decomposition temperature is less than the crystallization temperature of the substantially amorphous metal alloy to be formed. Precursor compounds suitable for use in this process may include organo-metallic compounds such as monomers, dimers, trimers and polymers having metallo-organic ligands composed of staurated and/or unstaturated hydrocarbons, aromatic or heteroaromatic ligands. Examples of such compounds and their decomposition temperatures are presented below in Table 1.

TABLE 1

| Precursor Metal-Bearing Compounds | |
|---|---|
| Compound | Approximate Decomposition Temperature (°C.) |
| Molybdenum Hexacarbonyl | 150 |
| Chromium Hexacarbonyl | 170 |
| Iron Pentacarbonyl | 140 |
| Butadiene Iron Tricarbonyl | 200 |
| Tungsten Hexacarbonyl | 170 |
| Tantalum (V) Chloride | 250 |
| Benzene Chromium Tricarbonyl | 200 |
| Bis (cyclopentadienyl) molybdenum tricarbonyl dimer | 200 |
| Di-Cobalt Octacarbonyl | 75 |
| Nickel Tetracarbonyl | 100 |
| Manganese Decacarbonyl | 175 |
| Iron Nonacarbonyl | 125 |

Other precursor compounds that may be non-metallic compounds, containing nitrogen, carbon, boron, phosphorous, arsenic, sulfur and silicon, may also be volatilized so as to incorporate these elements into the substantially amorphous multi-metallic alloy. Examples of such compounds include nitrogen, ammonia, silane compounds and chlorinated silane compounds, methane, ethane, ethylene, arsenic, arsine, phosphorus, phosphine, hydrogen sulfide, toluene and diborane.

Precursor compounds may also be halogen compounds, oxides, nitrates, nitrides, carbides, borides or metal-bearing salts, with the restriction that the decomposition temperature of the precursor compound be less than the crystallization temperature of the substantially amorphous multi-metallic alloy to be synthesized.

The substrate may be a metal or non-metallic substrate, as desired, with the only restriction that the substrate withstand the deposition process parameters. The substrate is typically heated to a temperature of from about 100° C. to about 700° C. The temperature required for most deposition reactions is in the range of from about 250° C. to about 400° C. Examples of substrates that are not affected by the subject process include glass, titanium, steel, copper, carbon, alumina and nickel. It is to be noted that the substrate may comprise any configuration, including intricate and complex configurations, and will be uniformly coated by the process taught herein.

An enclosed system is provided for the subject process to prevent contamination of the substantially amorphous coating. The atmosphere maintained in the enclosed system may be a vacuum, an inert atmosphere or a reactive atmosphere, depending on the substantially amorphous multi-metallic alloy coating to be synthesized. A coating having no elements incorporated therein other than those derived from precursor compounds injected into the reaction chamber may best be performed under vacuum or inert conditions. Carrier gases such as hydrogen, helium and argon may flow through the enclosed system. A substantially amorphous multi-metallic coating wherein at least one constituent of the coating may be incorporated from precursor non-metal bearing compounds may be synthesized under an atmosphere which comprises the non-metal bearing compound, such as an atmosphere of nitrogen, ammonia, methane, ethane, borane and the like. Precursor compounds may also be used that are liquid or solid at about 20° C., but which vaporize at slightly elevated temperatures. These compounds may be disposed in the enclosed reaction system and, upon heating, provide a reactive atmosphere for the deposition process.

The enclosed reaction system is maintained at a pressure of from about $1 \times 10^{-6}$ torr to about 700 torr. Other processes for deposition coatings such as electron beam evaporation, plasma spraying, sputtering and ion plating require high vacuum techniques and/or do not lend to the high uniformity that a vapor deposition process as taught herein can provide.

The precursor compounds are introduced into the enclosed system and heated by any known means so as to vaporize the compounds. The vaporized compounds are directed against a substrate that is maintained in the enclosed system at a temperature above the decomposition temperature of the precursor compounds. Upon contacting the substrate, a decomposition of the precursor compounds occurs and a coating becomes deposited on the substrate. Such a coating is uniform, adherent and economic to form on any type or configuration substrate. These coatings are found to be substantially amorphous multi-metallic coatings, generally having excellent corrosion resistant properties. As such, these coatings may be used on the interior surface of chemical reaction vessels, on structural metal exposed to sea water or other strongly corrosive environments, and on the interior surfaces of pipelines and pumps that transport acidic and/or alkaline chemicals. These amorphous coatings may also be used in catalytic reactions and electrochemical reactions, as well as magnetic thin films for information storage and metallic films for decorative and/or consumer items. Additional uses for these coatings would be evident to those skilled in the art.

EXAMPLES

The following examples demonstrate the effectiveness of the process disclosed herein to form amorphous multi-metallic alloy coatings. It is to be understood that these examples are utilized for illustrative purposes only and are not intended, in any way, to be limitative of the present invention.

EXAMPLE 1

This example describes the synthesis of a substantially amorphous multimetallic alloy coating having an approximate composition $Fe_{60} Mo_{20} Cr_{20}$, which was prepared in accordance with the process of the present invention.

Iron pentacarbonyl, $Fe(CO)_5$, which decomposes at about 140° C.; molybdenum hexacarbonyl, $Mo(CO)_6$, which decomposes at about 150° C. without melting; and chromium hexacarbonyl, $Cr(CO)_6$, which decomposes at about 170° C. were stored in separate stainless steel containers. Each container was separately connected to one chemical vapor deposition reaction chamber and the flow of carbonyl products into the chamber was controlled by metering valves. The containers which held the carbonyl compounds were heated to about 60° C. while the metering valves were in a closed position.

The chemical vapor deposition reactor was heated to about 70° C. and the pipelines connecting each carbonyl chamber to the deposition reactor were heated to about 90° C. Inside the reactor, a glass substrate was mounted onto a copper heater block that was maintained at a temperature of about 340° C. The iron pentacarbonyl was allowed to flow through the reactor at a pressure of about 1.2 torr, simultaneously with an equimolar flow of molybdenum hexacarbonyl and chromium hexacarbonyl. These materials entered the deposition reactor, were volatillized and directed toward the heated substrate whereupon they were decomposed.

After about 15 minutes, a coating of about 10,000 Angstroms thickness was obtained. Analysis of the coating by x-ray diffraction confirmed that this coating was a substantially amorphous multi-metallic alloy of approximate composition $Fe_{60} Mo_{20} Cr_{20}$.

Portions of the film were subjected to various environments at room temperature in order to test the corrosion resistance of the coating. The coating was tested as follows:

| Test Condition (25° C.) | Corrosion Rate (mm/yr.) |
|---|---|
| 1N Hydrofluoric Acid | 0.00 |
| Concentrated Hydrofluoric Acid (50 percent) | 0.00 |
| 1N Nitric Acid | 0.002 |
| Concentrated Nitric Acid | 0.18 |
| 1N Hydrochloric Acid | 0.00 |
| KOH/H$_2$O (50/50 wt/percent) | 1.00 |

As can be seen from these test results, this substantially amorphous coating exhibits excellent corrosion resistance under strongly acid and alkaline conditions.

EXAMPLE 2

A substantially amorphous multi-metallic alloy coating is described in this example which has an approximate composition $Cr_{40}Mo_{40}N_{20}$.

This composition was prepared in a manner similar to that described in Example 1 above, utilizing molybdenum hexacarbonyl and chromium hexacarbonyl. In this example, the iron pentacarbonyl used in Example 1 was replaced with a mixture comprising nitrogen and 25 weight percent ammonia ($NH_3$). The mixture of nitrogen and ammonia was allowed to flow through the reactor so that a pressure of about 1.2 torr was sustained in the reactor. The temperatures of the carbonyl containers, pipelines, reactor and substrate were the same as those recited in Example 1. Metering valves were opened to allow equimolar amounts of molybdenum hexacarbonyl, and chromium hexacarbonyl along with the nitrogen and ammonia flow, to enter the reactor and contact the heated glass substrate.

X-ray diffraction analysis confirmed that an amorphous metal alloy coating was deposited onto the glass substrate, which coating had an approximate composition $Cr_{40}Mo_{40}N_{20}$.

EXAMPLE 3

This example depicts the formation of a substantially amorphous multi-metallic alloy coating having a composition of about $Cr_{40}Mo_{40}C_{20}$.

This example follows the same procedure as set forth in Example 2 above except that the stream comprising nitrogen and 25 weight percent ammonia was replaced with a feedstream of toluene. This stream was allowed to flow through the reactor to produce a gas pressure in the reactor of about 1.2 torr. Following the same synthesis steps described in Example 2 above, equimolar amounts of the carbonyl materials were directed into the reaction chamber and, with the toluene streams, were directed against a heated glass substrate. A substantially amorphous multi-metallic coating was deposited on the glass substrate, which coating had an approximate composition of $Mo_{40}Cr_{40}C_{20}$, as confirmed by x-ray diffraction analysis.

This coating was then subjected to the same environments used to test the amorphous iron-molybdenum-chrome composition of Example 1. The results of corrosion testing of this amorphous chrome-molybdenum-carbon composition are as follows:

| Test Condition | Corrosion Rate (mm/yr.) |
| --- | --- |
| 1N Hydrofluoric Acid | 0.00 |
| Concentrated Hydrofluoric Acid (50 percent) | 0.00 |
| 1N Nitric Acid | 0.00 |
| Concentrated Nitric Acid | 0.00 |
| 1N Hydrochloric Acid | 0.00 |
| KOH/$H_2O$ (50/50 wt. percent) | 0.00 |

Thus it is seen that this substantially amorphous multimetallic alloy synthesized in accordance with this invention has the potential of functioning as a coating in extremely corrosive acid and alkaline environments with no significant degradation.

EXAMPLE 4

This example describes the formation of an iron-molybdenum amorphous alloy.

Molybdenum hexacarbonyl and iron pentacarbonyl were stored in separate stainless steel containers. Metering valves and piping allowed each material to communicate with a reaction chamber. A heated glass substrate was deposited in the reaction chamber and the reaction chamber was maintained at about 200° C. The substrate temperature was maintained at about 375° C. The reaction chamber was purged with argon and a partial vacuum of argon was thereafter maintained, between about 10 and 100 millitorrs. The metering valves were opened and equimolar amounts of the carbonyl materials were directed into the reaction chamber and against the substrate. A coating was formed on the substrate that, upon x-ray diffraction analysis, was determined to be an amorphous iron-molybdenum material.

The above-described examples demonstrate the formation of novel substantially amorphous multi-metallic alloy coatings in accordance with the process disclosed herein, wherein at least two precursor metal-bearing compounds are caused to form a coating on a substrate.

The selection of precursor metal-bearing compounds, substrates, reaction temperatures and other reactant conditions can be determined from the preceeding specification without departing from the spirit of the invention herein disclosed and described. The scope of the invention is intended to include modifications and variations that fall within the scope of the appended claims.

We claim:

1. A process for depositing a substantially amorphous multi-metallic coating of the formula:

$$M_a M'_b R_c$$

wherein
  M is at least one element selected from the group consisting of Mo, W, Nb and Ta;
  M' is at least one element selected from the group consisting of Fe, Ni, Co, Mn and Cr; and
  R is at least one element selected from the group consisting of P, B, N, As, S, Si and C; and
wherein
  a ranges from about 0.15 to about 0.85;
  b ranges from about 0.15 to about 0.85; and
  c ranges from greater than zero to about 0.25
with the proviso that when M' includes Cr, then the sum (due to M' elements other than Cr plus C) will be at least 0.15; on to a substrate, which process comprises the steps of:
  (a) providing at least two precursor metal-bearing compounds and one precursor nonmetallic element-bearing compound that each contain one of the metals and non-metal desired in said amorphous multi-metallic coating and which precursor compounds decompose at a temperature below the crystallization temperature of the amorphous multi-metallic coating to be formed;
  (b) heating said substrate in an enclosed system to a temperature of at least the decomposition temperature of said precursor compounds;
  (c) volatilizing said precursor compounds; and
  (d) contacting the volatilized precursor compounds with the substrate in said enclosed system so as to cause said substantially amorphous multimetallic coating to be formed on said substrate.

2. The process in accordance with claim 1 wherein said precursor metal-bearing compounds include organo-metallic compounds.

3. The process in accordance with claim 1 wherein said substrate comprises a material selected from the group including glass, titanium, steel, copper, carbon, alumina and nickel.

4. The process in accordance with claim 1 wherein said substrate is heated to a temperature between about 100° C. and about 700° C.

5. The process in accordance with claim 1 wherein said substrate is heated to a temperature between about 250° C. and about 400° C.

6. The process in accordance with claim 1 wherein said enclosed system is maintained at a pressure of from about $1 \times 10^{-6}$ torr to about 700 torr.

7. The process in accordance with claim 1 wherein the atmosphere within said enclosed system comprises an inert gas.

8. The process in accordance with claim 1 wherein the atmosphere within said enclosed system comprises a precursor non-metallic compound.

9. A substrate having a substantially amorphous multi-metallic alloy coating of the formula:

$$M_a M'_b R_c$$

wherein
M is at least one element selected from the group consisting of Mo, W, Nb and Ta;
M' is at least one element selected from the group consisting of Fe, Ni, Co, Mn and Cr; and
R is at least one element selected from the group consisting of P, B, N, As, S, Si and C; and
wherein
a ranges from about 0.15 to about 0.85;
b ranges from about 0.15 to about 0.85; and
c ranges from greater than zero to about 0.25
with the proviso that when M' includes Cr, then the sum (due to M' elements other than Cr plus C) will be at least 0.15 thereon formed by the process which comprises the steps of:
(a) providing at least two precursor metal-bearing compounds and one precursor nonmetallic element-bearing compound that each contain one of the metals and non metals desired in said amorphous multi-metallic coating and which precursor compounds decompose at a temperature below the crystallization temperature of the amorphous multi-metallic coating to be formed;
(b) heating said substrate in an enclosed system to a temperature of at least the decomposition temperature of said precursor compounds;
(c) volatilizing said precursor compounds; and
(d) contacting the volatilized precursor compounds with the substrate in said enclosed system so as to cause said substantially amorphous multi-metallic coating to be formed on said substrate.

10. The substantially amorphous multi-metallic alloy coating in accordance with claim 9 wherein said alloy is at least eighty percent amorphous.

11. The substantially amorphous multi-metallic alloy coating in accordance with claim 9 wherein said alloy is about one hundred percent amorphous.

12. The substantially amorphous multi-metallic alloy coating in accordance with claim 9 wherein said alloy comprises Cr, Mo and N.

13. The substantially amorphous multi-metallic alloy coating in accordance with claim 12 wherein said alloy has an approximate composition $Cr_{40}Mo_{40}N_{20}$.

14. The substantially amorphous multi-metallic alloy coating in accordance with claim 9 wherein said alloy comprises Cr, Mo and C.

15. The substantially amorphous multi-metallic alloy coating in accordance with claim 14 wherein said alloy has an approximate composition $Cr_{40}Mo_{40}C_{20}$.

* * * * *